(12) United States Patent
Falk et al.

(10) Patent No.: US 10,178,814 B2
(45) Date of Patent: Jan. 8, 2019

(54) INVERTER AND METHOD FOR COOLING AN INVERTER

(71) Applicant: SMA Solar Technology AG, Niestetal (DE)

(72) Inventors: Andreas Falk, Kassel (DE); Jan Goldau, Kaufungen (DE); Thomas Kuehn, Warburg (DE); Henning Schneider, Kassel (DE); Jochen Roemer, Diemelstadt (DE)

(73) Assignee: SMA Solar Technology AG, Niestetal (DE)

( * ) Notice: Subject to any disclaimer, the term of this patent is extended or adjusted under 35 U.S.C. 154(b) by 0 days.

(21) Appl. No.: 15/586,554

(22) Filed: May 4, 2017

(65) Prior Publication Data
US 2017/0238445 A1 Aug. 17, 2017

Related U.S. Application Data

(63) Continuation of application No. PCT/EP2015/074344, filed on Oct. 21, 2015.

(30) Foreign Application Priority Data

Nov. 4, 2014 (DE) .................. 10 2014 116 084

(51) Int. Cl.
*H05K 7/20* (2006.01)
*H02M 7/00* (2006.01)
*H02M 7/44* (2006.01)

(52) U.S. Cl.
CPC ........ *H05K 7/20909* (2013.01); *H02M 7/003* (2013.01); *H02M 7/44* (2013.01)

(58) Field of Classification Search
CPC ...... H05K 7/20909; H05K 7/20; H05K 7/206; H05K 7/20945; H02M 7/003; H02M 7/44; H02M 7/00; F02B 63/04; B60L 3/003
USPC .......... 361/692, 694, 695, 141; 165/47, 157, 165/168, 164, 910; 363/141
See application file for complete search history.

(56) References Cited

U.S. PATENT DOCUMENTS 3,364,838 A * 1/1968 Bradley ................. A47B 81/00
165/80.3
4,699,208 A 10/1987 Wolf et al.
(Continued)

FOREIGN PATENT DOCUMENTS

CN 102111081 A 6/2011
CN 203086321 U 7/2013
(Continued)

*Primary Examiner* — Mandeep S Buttar
(74) *Attorney, Agent, or Firm* — Eschweiler & Potashnik, LLC

(57) ABSTRACT

The disclosure relates to an inverter, in particular for a photovoltaic system, including a housing with at least one chamber and a cooling air channel formed within the chamber for guiding ambient air as cooling air for electrical and/or electronic components of the inverter disposed along the cooling air channel. The cooling air channel extends through the housing from an air inlet to an air outlet. The inverter includes a further air outlet provided within the cooling air channel between two of the components to be cooled, and is arranged above the air inlet and the air outlet. The disclosure further relates to a method of cooling such an inverter.

14 Claims, 3 Drawing Sheets

(56) References Cited

U.S. PATENT DOCUMENTS

| | | | |
|---|---|---|---|
| 8,325,479 B2 * | 12/2012 | Siracki | H05K 7/20918 |
| | | | 361/678 |
| 2006/0171115 A1 | 8/2006 | Cramer | |
| 2007/0279863 A1 | 12/2007 | Illerhaus | |
| 2012/0014062 A1 * | 1/2012 | Siracki | H05K 7/20145 |
| | | | 361/692 |

FOREIGN PATENT DOCUMENTS

| | | |
|---|---|---|
| CN | 203179669 U | 9/2013 |
| DE | 4106684 | 9/1992 |
| DE | 19524115 A1 | 1/1997 |
| JP | H02249755 A1 | 10/1990 |
| JP | H05121887 A | 5/1993 |

\* cited by examiner

INVERTER AND METHOD FOR COOLING AN INVERTER

CROSS REFERENCE TO RELATED APPLICATIONS

This application claims priority to International Patent Application number PCT/EP2015/074344, filed on Oct. 21, 2015, which claims priority to German Patent Application number 10 2014 116 084.3, filed on Nov. 4, 2014, and is hereby incorporated by reference in its entirety.

FIELD

The disclosure relates to an inverter, in particular for a photovoltaic (PV-) system comprising a housing with at least one chamber and a cooling air channel formed within the chamber for guiding ambient air as cooling air for electrical and/or electronic components of the inverter arranged along the cooling air channel, wherein the cooling air channel extends through the housing from an air inlet to an air outlet. The disclosure further relates to a method of cooling an inverter.

BACKGROUND

Inverters are—inter alia in PV-systems—used to convert the DC current into AC current conformal for feeding into an energy supply grid. In particular, inverters of high-power, like those used in solar farms, comprise a housing formed as a cabinet. Typically, ambient air is used as cooling air for heat generating electric and/or electronic components of the inverter. For this purpose, the inverter comprises a cooling air channel extending through the housing of the inverter. The beginning and the end of the cooling air channel are associated with an air inlet and an air outlet, respectively, disposed in a wall of the housing, for example the back wall or a sidewall. Within the housing, the cooling air channel runs along the components to be cooled, folded where required, in order to remove heat generated during operation by the cooling air. By a folded implementation, for example a meander-like implementation of the cooling air channel, its length within the housing may be increased and it may be achieved that the cooling air channel runs along all components to be cooled. The contact between the cooling air flowing through the cooling air channel and the components to be cooled may be optimized and the speed of the airflow of the cooling air may be increased. Both effects result, on average, in an improved cooling effect at a given volume flow of the cooling air.

The housing of the inverter may be separated into multiple chambers by partition walls, such that the chambers may be assigned to different protection classes with regard to their sealing against the ambient. For example it is known to separate the housing of the inverter into two chambers, wherein the mentioned cooling air channel extends through one of the chambers, while the further chamber is hermetically sealed against the ambient. The sealed chamber receives the sensitive components of the inverter, which usually are the electronic components. A circulating cooling airflow may be established within the sealed chamber, wherein a heat exchanger is provided for cooling the circulating cooling airflow in the sealed chamber by the ambient cooling airflow guided through the cooling air channel.

In an inverter, a cooling requirement exists in particular for the power semiconductor of the inverter bridges. Since high-power inverters like the above-mentioned inverters of solar farms are polyphase inverters, a plurality of inverter bridges are used that may be collectively also referred to as a stack. Further components having an increased cooling requirement within the inverter are inductors, also referred to as inductor coils, of output current filters and/or of DC converters of the inverter. Output current filters are used to smoothen the output current signal and therefore are also referred to as sinus filters. DC converters may be arranged upstream of the inverter bridges in order to increase the input voltage present at the inverter (boost converter) or to decrease the input voltage (buck converter). They use inductor coils as an energy store during conversion of the voltage.

Within the cooling airflow, inductor coils are usually arranged downstream of the stack, since the stack has an increased cooling demand and requires cooling air at a lower temperature level. Frequently, the problem arises that the amount of cooling air is not optimal for both, the stack and the inductor coils.

In document DE 41 06 684 A1, an air cooling concept for the field of automotive is described for feeding air to several units. The possibility is given to guide different cooling airflows sectionwise in parallel in order to adjust the air demand of components to be cooled individually by valve flaps. Furthermore, the possibility is described to provide air outlets between several components arranged sequentially within a cooling airflow, the cooling airflow for the single components being individually adjustable by the outlets. The cooling concept described in the mentioned document, however, requires a cooling airflow generated by a fan.

Furthermore, in document DE 20 2006 008 792 U1 a solar inverter is shown comprising an angled course of a cooling air channel between an inlet and an outlet for cooling air.

For an inverter of a PV system the converted power varies significantly depending on insolation conditions of the solar radiation. For reasons of energy efficiency it is desirable within the partial load regime of the inverter to not generate the cooling airflow actively by a fan, but to achieve a sufficient cooling in the partial load regime solely by convection. This way, the low PV power of a PV generator is not further reduced by the power consumption of the fan.

SUMMARY

The present disclosure is directed to an inverter, where components arranged along a cooling air channel are optimally and energy efficiently cooled by ambient air under full load as well as under partial load. It is a further task to provide a suitable method for cooling the inverter.

An inverter according to the disclosure of the aforementioned kind, in particular for a PV system, comprises a further air outlet provided in the cooling air channel between two of the components to be cooled and is arranged above the air inlet and above the air outlet. In this case, the demand that the further outlet is arranged above the air inlet and above the air outlet advantageously includes that the full cross-section of the further air outlet is arranged above the air inlet and also above the air outlet. However, it is also within the scope of the disclosure if only a part of the full cross-section of the further air outlet is arranged above the air inlet and above the air outlet. The term "above" here refers to a relative position of elements within the inverter during operation according to the installation instruction or other operation recommendations. This is valid for the term "below" in an analogous manner. More particularly, the term "above" herein refers to a relative position of the further air outlet relative to the air inlet and relative to the air outlet, when the inverter is installed properly as highlighted above.

Under normal operation, for example under full load of the inverter, the flow of the cooling air is usually generated by a fan. The further air outlet at the described position results in a reduced cooling airflow between both air outlets within the cooling air channel. Accordingly, the components arranged within this (downstream) section of the cooling air channel and having a reduced cooling demand, are cooled less intensively, whereas in an upstream section of the cooling air channel a more intensive cooling exists. The pressure drop within the cooling air channel is reduced and the fan may be selected to be smaller or may be operated more energy efficiently at a predetermined airflow.

Under partial load conditions of the inverter, the cooling demand of the components may be small enough to obviate operation of the fan. With a deactivated fan, the cooling air is only passively guided by convection through the cooling air channel. The spatial arrangement of the further air outlet above the air inlet in combination with heat sources arranged in the cooling air channel causes a convectional cooling airflow within the upstream section (e.g., defined by a section located between the air inlet and the further air outlet) of the cooling air channel in the same direction as under operation of the fan. The cooling air enters through the air inlet and exits the cooling air channel after warming up through the further air outlet. With deactivated fan, convection further causes the cooling air to enter the cooling air channel through the air outlet, to absorb heat from the components arranged in the downstream section of the cooling air channel, and to exit the cooling air channel through the further air outlet, too. In this downstream section (e.g., defined by a section between the further air outlet and the air outlet) of the cooling air channel, an airflow is caused during convectional operation opposite to the direction during vented or full load operation. Through both sections (an upstream section arranged between the air inlet and the further air outlet, and a downstream section arranged between the air outlet and the further air outlet, respectively) "fresh" ambient air is guided that has not yet absorbed heat from an otherwise upstream section of the cooling air channel. This way, a sufficient cooling of all components is achieved also in the solely convectional operation.

In an advantageous embodiment of the inverter, a component having the highest cooling demand of the components of the inverter is arranged between the air inlet and the further air outlet. In one embodiment, this component is a cooling body of at least one inverter bridge of the inverter. It is also of advantage to arrange a component to be cooled with reduced cooling demand between the further air outlet and the air outlet. In one embodiment, this component is at least one inductor coil of the inverter, and forms part of a DC converter connected upstream of the inverter bridge, or forms part of an output current filter connected downstream of the inverter bridge. The assignment of the various mentioned components of the inverter to different sections of the cooling air channel described in these embodiments lead to a particularly efficient operation of the cooling system with activated fan as well as in passive operation without the fan due to the differing heat generation of the components.

A particular advantage is achieved, if the at least one inductor coil comprises a ferrite core. Such an inductor coil exhibits particularly low loss when operated at elevated temperatures compared to the ambient. This elevated temperature is particularly achieved, if the inductor coil is arranged within the cooling air channel between the further air outlet and the air outlet.

In a further advantageous embodiment of the inverter, the further air outlet is adjustable with regard to the effective outlet cross section An adjustment of the effective outlet cross-section, for example achievable by adjustable slats arranged in front of the further air outlet, enables to adjust the cooling effect in the downstream section of the cooling air channel during active, fan supported cooling operation without significantly impacting the cooling effect in the upstream section.

In a further, advantageous embodiment of the inverter, the cooling air channel is folded and in particular designed in a meander shape. In addition, the air outlet and the further air outlet may be disposed at different sides of the housing. Both embodiments allow for guidance of cooling air within the housing of the inverter that can be flexibly adjusted to the position of the components to be cooled.

In a further advantageous embodiment of the inverter, a further chamber beside the chamber is formed inside of the housing, wherein the chamber and the further chamber are separated such that an air exchange between the chamber and the further chamber is prevented, and wherein the chamber and the further chamber are assigned to different protection classes. In one embodiment, the chamber in which the cooling air channel is located, exhibits a lower protection class compared to the further chamber. By separating the inside of the housing of the inverter into the two different chambers, the above described cooling concept can also be realized in inverters requiring a higher protection class for at least some of the components. The protection classes may for example be defined as so-called IP protection classes (international protection classes).

Within a method for cooling an inverter, in particular an inverter for a PV system, according to the disclosure, the inverter comprises a housing with at least one chamber, wherein a cooling air channel for guiding ambient air as cooling air for electrical and/or electronic components of the inverter is formed within the chamber, the components being arranged along the cooling air channel, wherein the cooling air channel extends through the housing from an air inlet to an air outlet, wherein a further air outlet is provided between two of the components to be cooled, and wherein the inverter comprises a fan arranged within or at the cooling air channel. The method comprises the following acts: the inverter is operated under normal operation with an activated fan, such that an airflow entering through the air inlet into the chamber and exiting the chamber at the air outlet and the further air outlet is generated within the chamber. In a further act, the inverter is operated under partial load mode with a deactivated fan, such that a different airflow is generated entering the chamber through the air inlet and the air outlet and exiting the chamber through the further air outlet. The advantages mentioned in conjunction with the inverter according to the disclosure are achieved.

BRIEF DESCRIPTION OF THE DRAWINGS

The disclosure is subsequently described in detail by figures showing embodiments, wherein.

DETAILED DESCRIPTION

Figure 1:
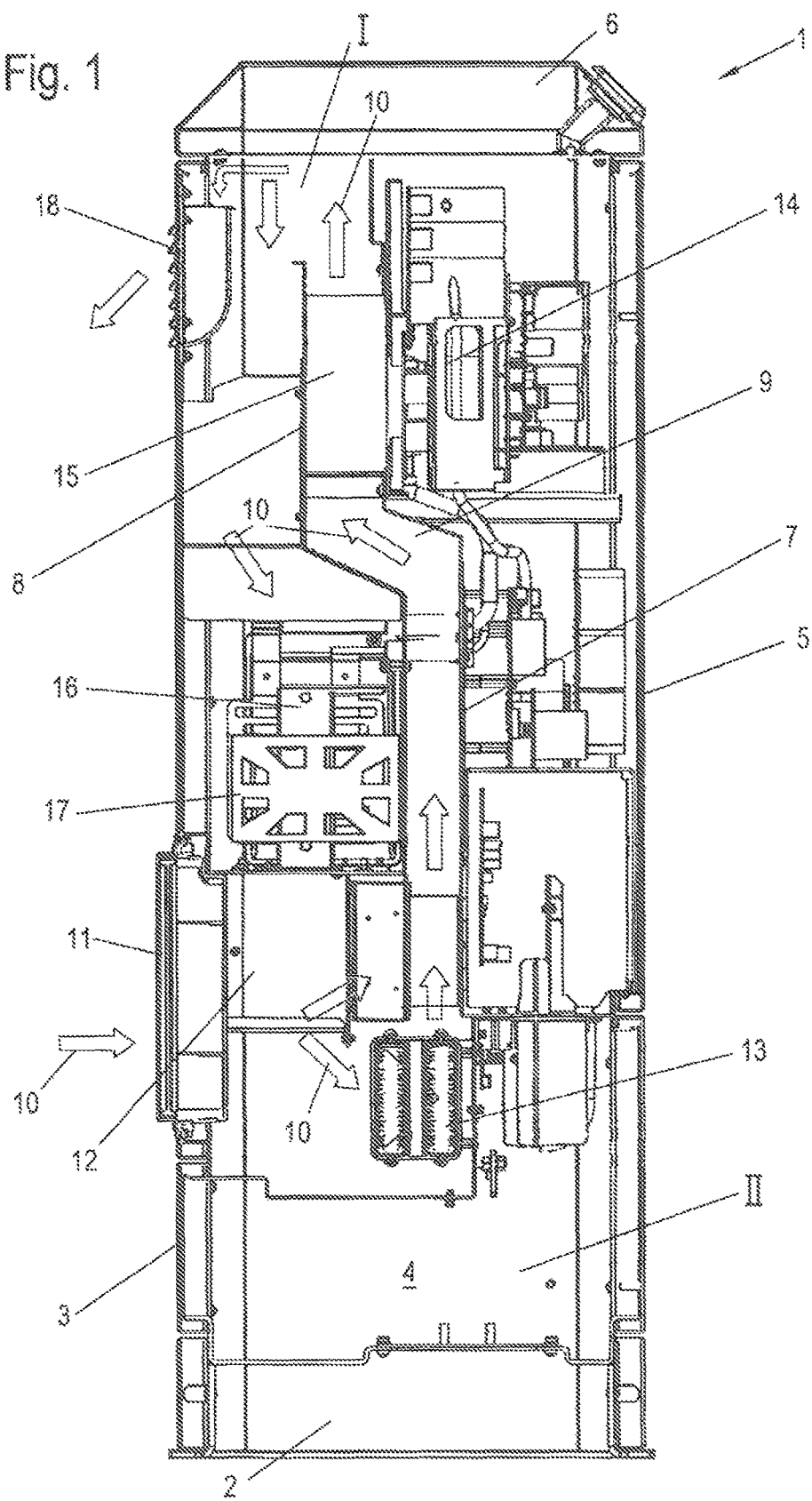
FIG. 1 shows an inverter with a housing in a lateral cross-section.
Figure 2:
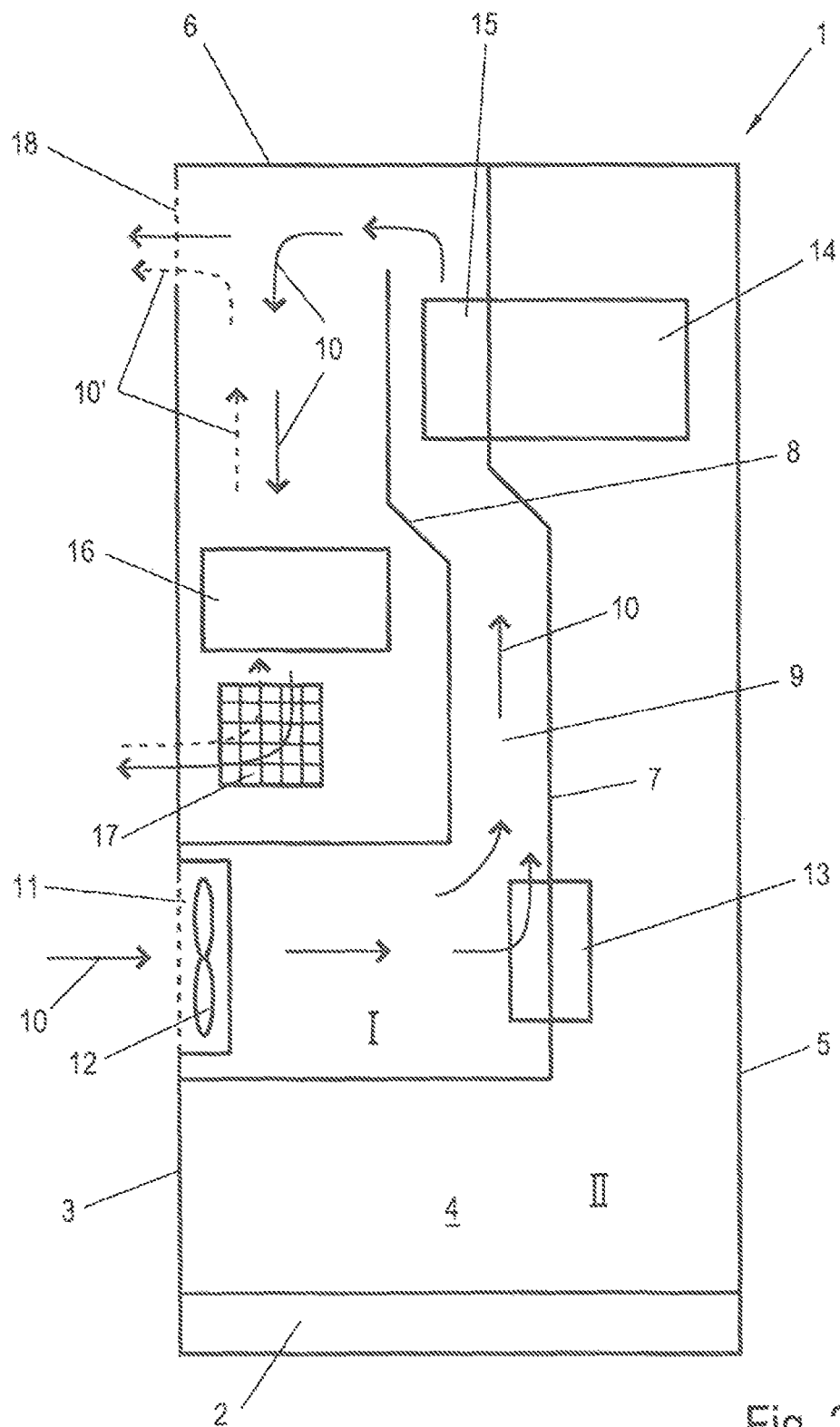
FIG. 2 shows a schematic, simplified illustration of the inverter of FIG. 1.

In FIGS. 1 and 2, an inverter according to an embodiment is shown in a lateral cross-section. FIG. 1 shows the inverter in a higher degree of detail, whereas FIG. 2 shows the inverter in a schematic, simplified illustration. In the following, reference is made to both figures.

The inverter comprises a housing 1, formed as a cabinet mounted on a mounting surface. The housing 1 comprises a pedestal 2, a backside wall 3, sidewalls 4, of which only one sidewall 4 is visible, a door 5 also forming the front side of the housing 1, and a lid 6. Within the housing 1, a partition wall 7 splits the inside of the housing 1 into two separate chambers, a chamber I and a further chamber II. In the chamber I, an air baffle 8 is arranged such that a cooling air channel 9 is formed starting at air inlet 11 and running through the chamber I in a folded manner. An airflow 10 through the cooling air channel 9 is symbolized within the figures by arrows.

Figure 3:
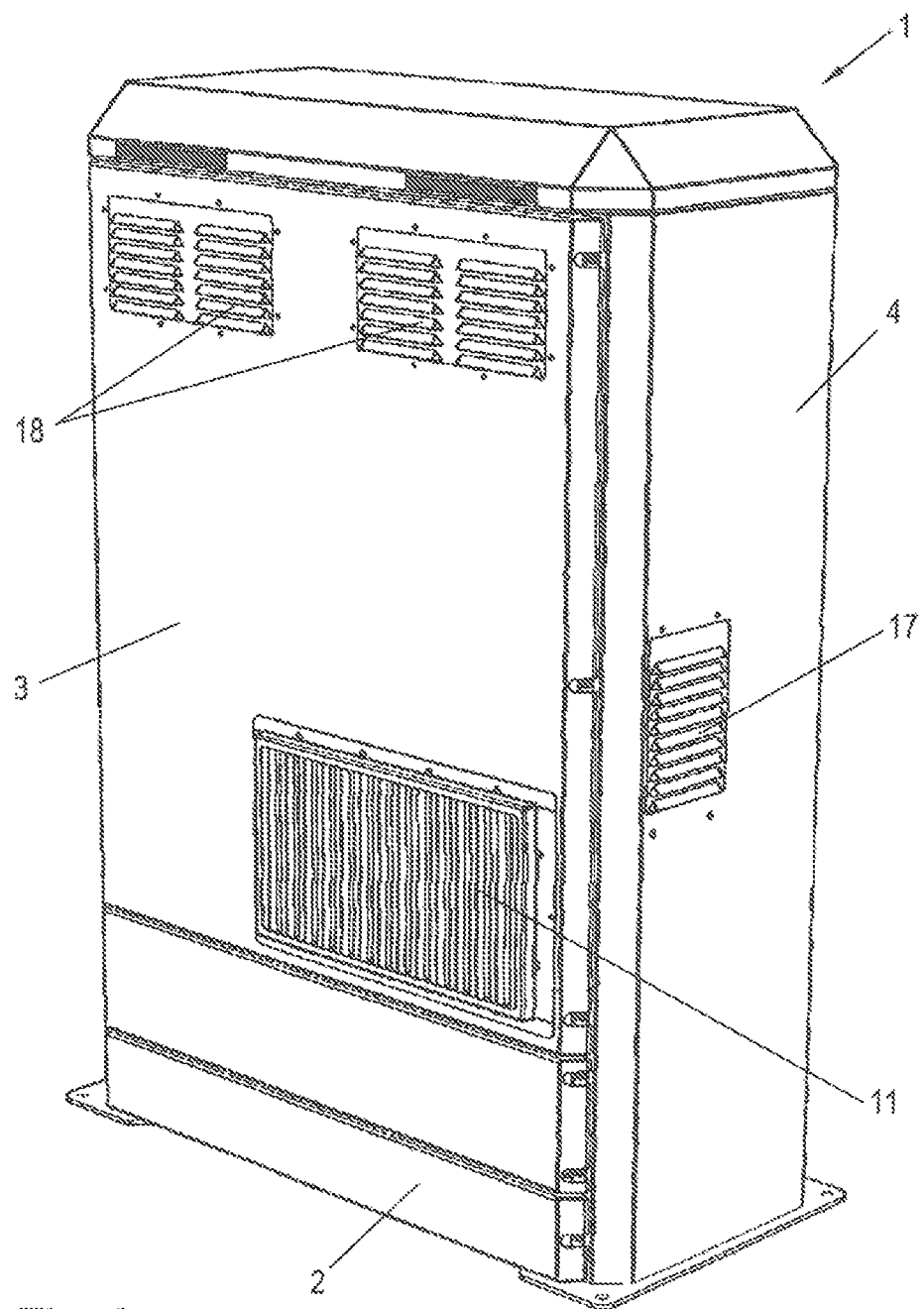
FIG. 3 shows a perspective outside view of the inverter of FIG. 1.

The air inlet 11 is integrated into the back side wall 3 of the housing 1 and extends approximately over half of the width of the backside wall 3. This is evident in FIG. 3 in a perspective view of the housing 1 of the inverter. The housing 1 is shown in FIG. 3 in a slanted backside view. In the illustrated embodiment, the cooling air channel 9 extends over the full width of the housing 1, while the air inlet 11 is formed only over a portion of this width. It may as well be considered to provide an air inlet 11 extending substantially over the full width of the cooling air channel 9 and therefore over the full width of the housing 1. An air inlet extending over the full width of the cooling air channel 9 and therefore over the full width of the housing one may as well be realized by a plurality of air inlets.

With regard to the height, the air inlet 11 is arranged approximately in the upper half of the lower third of the housing 1. An arrangement in a section of the housing 1 below this position may be disadvantageous since the risk of soaking in dust or other dirt from the earth is increased with a lower positioned air inlet.

The air inlet 11 is provided with a dirt grid in the illustrated embodiment. Alternatively and/or additionally, an air maze may be arranged downstream the air inlet 11. Behind the air inlet 11, a fan 12 is arranged that may be operated to soak in air through the air inlet 11 and generate or amplify an potentially existing airflow. An arrangement of the fan 12 at a different position of the cooling air channel 9 is, however, as well contemplated.

Within the housing 1, the air first flows in the horizontal section of the cooling air channel 9 that transitions into the vertical section approximately in the center of the housing 1. At the end of the horizontal section, and air/air heat exchanger 13 is located with a portion of the flow 10 in the cooling air channel 9 flowing through and/or over or around it. This air/air heat exchanger 13 thermally couples the further chamber II to the cooling air channel 9 of the chamber I. FIG. 1 illustrates the case that air from the chamber II flows through the air/air heat exchanger 13, while air inside the chamber I flows around or over it. Alternatively or cumulatively, it is also possible that air from the chamber I flows through the air/air heat exchanger 13, while air from the chamber II flows around or over it. Also this way the thermal coupling of the further chamber II to the cooling air channel 9 of the chamber I may be realized, wherein an air exchange between chamber I and chamber II is suppressed. Further chamber II is hermetically sealed against the ambient as much as possible, and therefore complies with a higher protection class, for example the protection class IP 54. In the further chamber II, primarily electronic, sensitive components of the inverter are housed, for example the inverter bridges 14, in the following also refer to as stack 14, are arranged in an upper section of the further chamber II. In the further chamber II a self-contained ambient airflow is generated to absorb heat from the components to be cooled and release the heat via the air/air heat exchanger 13 to the cooling air of the cooling air channel 9. The self-contained ambient airflow in the further chamber II is generated by a further fan located in the further chamber II (not shown in FIGS. 1 and 2). Alternatively, it is also possible that the self-contained ambient airflow in the further chamber II is generated by convection only and therefore requires no further fan.

The cooling air flowing through the air/air heat exchanger 13 and the cooling air passing the air/values exchanger 13 join in the vertical section of the cooling air channel 9 and are guided along the cooling ribs of the cooling body 15 to release heat from the power electronics components. The cooling ribs extend into the cooling air channel 9, wherein the separation between the chamber I and the further chamber II is maintained in this case as well. Under full load during feeding, the maximum demand of cooling air exists at the cooling body 15. The airflow in the cooling air channel 9 is therefore determined with regard to the amount of cooling air by the demand of cooling air of the cooling body 15, or the power electronics components of the stack 14, respectively.

The air baffle 8 ends in the upper section of the chamber I in front of the lid 6, wherein the cooling air channel 9 comprises a turn in this area to deflect the airflow downwards. In this case, the air baffle 8 may end above as well as slightly below the cooling body 15. The cooling air then passes several inductor coils 16 in a section located approximately at two thirds of the height of the housing 1 in order to cool them. The inductor coils 16 are, on the one hand, chokes of the so-called sinus filter that has the purpose to form the signal of the current output of the inverter and fed into a power grid at an output of the inverter bridge 14. Furthermore, chokes of a DC converter connected upstream of the inverter bridges are arranged in the mentioned area, in case the inverter comprises such DC converters. The DC converter is in particular a buck converter or a boost converter or a combined buck—boost converter.

After passing the inductor coils 16, the airflow exits to the environment through an air outlet 17 in the sidewall 4. The air outlet 17 is arranged in a sidewall 4 in the illustrated embodiment. It is, however, also possible to arrange the air outlet 17 in the backside wall 3 of the housing 1. Furthermore, it is possible to arrange one air outlet 17 in each of the two sidewalls 4. The lateral arrangement of the air outlet 17 in a sidewall 4 is well seen in the perspective view of the FIG. 3.

As already mentioned, the cooling demand of the stack 14 determines the airflow through the cooling air channel 9 under full load. The inductor coils 16 usually have a lower demand of cooling air compared to the stack 14. Additionally, the inductor coils 16 are often provided with a ferrite core in order to achieve higher inductance values at a given overall size compared to air coils. Ferrite materials are characterized by a particularly low power loss by re-magnetization in the frequency range used and a characteristic temperature range. Depending on the material, the temperature at which losses are minimized may be up to 100° C. At this temperature or at least at an operating temperature close to this temperature, losses in the inductor coils 16 are lowest and the inverter may be operated in a particularly energy-efficient manner.

If the inductor coils 16 are, however, cooled with the full airflow in the cooling air channel 9 required to cool the stacks 14, the temperature of the inductor coil 16 will be below the optimum temperature range. For this reason, a further air outlet 18 is arranged in the cooling air channel 9 between the cooling body 15 of the stack 14 and the inductor coils 16, so that a portion of the airflow in the cooling air channel 9 exits through the air outlet 18 before the remaining airflow reaches the inductor coils 16. By a suitable adjustment of the flow resistance of the further air outlet 18, for example by a variation of the effective air exit cross section of the air outlet 18, the ratio of the amount of cooling air exiting the cooling air channel 9 at the further air outlet 18 and the amount of cooling air available for cooling the inductor coils 16 may be suitably adjusted.

As the case may be, an actively adjustable actuation means in the further air outlet 18 may be used by which an effective air exit cross section may be modified and therefore the amount of air exiting through the further air outlet 18 is adjustable.

The further air outlet 18 is in this case arranged in the backside wall 3. It is to be understood that an arrangement in one or more of the sidewalls 4 is as well possible. In order to prevent intrusion of dirt, rainwater or even small animals, the further air outlet 18 is provided advantageously with a dirt grid and rainwater repeller. The further air outlet 18 comprises two openings arranged side-by-side and is arranged directly below the lid 6 and therefore at or close to a highest point within the cooling air channel 9 in the illustrated embodiment.

This arrangement of the further air outlet 18 above the air inlet 11 and also above the air outlet 17 therefore fulfills a specific purpose, on the one hand in partial load operation, i.e. at deactivated fan 12, on the other hand also in normal operation of the inverter, i.e. at activated fan 12. In partial load operation of the inverter, the cooling demand of the components, in particular also of the stack 14, may be so low that the fan 12 does not need to be operated. With deactivated fan 12, the cooling air is only guided through the cooling air channel 9 passively and by convection. The arrangement of the further outlet 18 above the air inlet 11 in combination with heat drains such as the air/air heat exchanger 13 and/or the cooling body 15 arranged in the cooling air channel, lead to a cooling airflow generated by convection in this portion of the cooling air channel 9 having the same direction compared to operation of the fan 12. The cooling air enters through the air inlet 11 and exits as warm air through the further air outlet 18 after picking up heat at the air/air heat exchanger 13 and the cooling body 15 of the housing 1. Convection further causes cooling air to enter the air outlet 17 at deactivated fan 12, to absorb heat from the inductor coils 16 and to exit the cooling air channel 9 through the air outlet 18 as well.

In this section of the cooling air channel 9, during convection mode operation an air flow 10' is generated in opposite direction as compared to fan mode operation, or with activated fan 12, respectively. The air flow 10' during convection mode operation is denoted in FIG. 2 by dashed flow arrows. By the arrangement of the further air outlet 18 above the air outlet 17, a vertical orientation of the section of the cooling air channel 9 disposed between both outlets is achieved resulting in a more pronounced convection due to the chimney-effect and therefore in an advantageous cooling effect compared to a horizontal orientation of this section.

Under normal operation, such as full load operation, i.e. with activated fan 12, the further air outlet 18 at the described location results in an air pressure drop counteracting the airflow 10' to be overall reduced. Accordingly, the fan 12 may be designed to be smaller at an airflow 10 determined by the stack 14. Furthermore, the amount of air for cooling the inductor coils 16 in a downstream section of the cooling air channel 9 may be adjusted even with a intense airflow 10 within the upstream section of the cooling air channel 9, such that the inductor coils 16 are operated in a temperature regime characterized by a particularly low power loss. An excessive cooling of the inductor coils 16 by a potentially excessive airflow 10 required to remove heat from the stack 14 is therefore prevented. Advantageously, means for designing the effective cross section of the air outlet 18 to be adjustable are provided at the further air outlet 18 so as to adjust the airflow 10, or the amount of the air flow 10, exiting with activated fan 12 at the further air outlet 18. Such means may be realized for example by slidable screening sheets, not explicitly shown in the FIGS. 1 to 3. The cooling concept shown therefore results in both cases, i.e. during operation with activated fan and during passive, convection mode operation, in a sufficient cooling airflow at all components to be cooled.

The invention claimed is:

1. An inverter, in particular for a photovoltaic system, comprising: a housing with at least one chamber and a cooling air channel formed within the chamber for guiding ambient air as cooling air for electrical and/or electronic components of the inverter disposed along the cooling air channel, wherein the cooling air channel extends through the housing from an air inlet to an air outlet, thereby defining an air flow path, and a further air outlet provided within the cooling air channel between two of the components of the inverter to be cooled along the airflow path, and arranged above the air inlet and the air outlet.

2. The inverter of claim 1, wherein the further air outlet is adjustable with regard to its effective air outlet cross section.

3. The inverter of claim 1, wherein the cooling air channel is folded and formed as a meander.

4. The inverter of claim 1, wherein the air outlet and the further air outlet are arranged at different sides of the housing.

5. The inverter of claim 1, further comprising:
a further chamber formed inside the housing and beside the chamber,
wherein the chamber and the further chamber are separated from each other such that an exchange of air between the chamber and the further chamber is prevented, and
wherein the chamber meets the requirements of a first protection class and the further chamber meets the requirements of a second, different protection class.

6. The inverter of claim 5, wherein the chamber comprising the cooling air channel is assigned to a lower protection class than the further chamber.

7. The inverter of claim 1, further comprising a fan arranged within or at the cooling air channel of the housing.

8. An inverter, in particular for a photovoltaic system, comprising:
a housing with at least one chamber and a cooling air channel formed within the chamber for guiding ambient air as cooling air for electrical and/or electronic components of the inverter disposed along the cooling air channel,
wherein the cooling air channel extends through the housing from an air inlet to an air outlet, thereby defining an air flow path, and
a further air outlet provided within the cooling air channel between two of the components of the inverter to be cooled along the airflow path, and arranged above the air inlet and the air outlet, wherein a component of the inverter to be cooled with a maximum cooling requirement is disposed between the air inlet and the further air outlet.

9. The inverter of claim 8, wherein the component of the inverter disposed between the air inlet and the further air outlet comprises a cooling body of at least one inverter bridge of the inverter.

10. An inverter, in particular for a photovoltaic system, comprising:
   a housing with at least one chamber and a cooling air channel formed within the chamber for guiding ambient air as cooling air for electrical and/or electronic components of the inverter disposed along the cooling air channel,
   wherein the cooling air channel extends through the housing from an air inlet to an air outlet, thereby defining an air flow path, and
   a further air outlet provided within the cooling air channel between two of the components of the inverter to be cooled along the airflow path, and arranged above the air inlet and the air outlet, wherein a further component of the inverter to be cooled with reduced cooling requirement is disposed between the air outlet and the further air outlet.

11. The inverter of claim 10, wherein the further component of the inverter disposed between the air outlet and the further air outlet comprises at least one inductor coil of the inverter.

12. The inverter of claim 11, wherein the at least one inductor coil is part of a DC converter connected upstream of the inverter bridge.

13. The inverter of claim 11, wherein the at least one inductor coil is part of an output current filter connected downstream of the inverter bridge.

14. The inverter of claim 11, wherein the at least one inductor coil comprises a ferrite core.

* * * * *